(12) United States Patent
Morand et al.

(10) Patent No.: US 8,598,038 B2
(45) Date of Patent: Dec. 3, 2013

(54) PROCESS FOR PRODUCING TWO INTERLEAVED PATTERNS ON A SUBSTRATE

(76) Inventors: Yves Morand, Grenoble (FR); Thierry Poiroux, Voiron (FR)

( * ) Notice: Subject to any disclaimer, the term of this patent is extended or adjusted under 35 U.S.C. 154(b) by 333 days.

(21) Appl. No.: 13/187,784

(22) Filed: Jul. 21, 2011

(65) Prior Publication Data

US 2012/0021606 A1    Jan. 26, 2012

(30) Foreign Application Priority Data

Jul. 22, 2010  (FR) ...................................... 10 55979

(51) Int. Cl.
  *H01L 21/311* (2006.01)
(52) U.S. Cl.
  USPC ........... 438/702; 438/942; 438/943; 438/944; 438/945; 438/946; 257/E21.249
(58) Field of Classification Search
  None
  See application file for complete search history.

(56) References Cited

U.S. PATENT DOCUMENTS

| | | |
|---|---|---|
| 5,330,879 A | 7/1994 | Dennison |
| 6,429,123 B1 | 8/2002 | Tseng |
| 6,750,100 B2 | 6/2004 | Hsu et al. |
| 8,329,512 B2 * | 12/2012 | Nguyen et al. ................ 438/128 |
| 2007/0166981 A1 | 7/2007 | Furukawa et al. |
| 2011/0084356 A1 * | 4/2011 | Saarnilehto et al. .......... 257/506 |

OTHER PUBLICATIONS

French Search Report Mailed Feb. 9, 2011 for FR 1055979 (2 pgs.).
Logan, Joseph S., et al.: "A study of voids in sputtered $SiO_2$"; J. Vac. Sci. Technol. A 7 (3), May/Jun. 1989; pp. 1392-1396.
Gras, R., et al.: "Mult levelsAir Gap Integration using Sacrificial Material Approach for Advanced Cu Interconnects Technologies"; STMicroelectronics, Crolles France (6 pgs.).
Cahay, Marc, et al.: "Semiconductor quantum devices"; 1993 IEEE, (pgs. 18-23).
Gras, R., et al.: "Multi Levels Air Gap Integration Using Sacrificial Material Approach for Advanced Cu Interconnects Technologies," STMicroelectronics, Crolles France, ADMETA 2008: Asian Session, pp. 142-143.

* cited by examiner

*Primary Examiner* — Fernando L Toledo
*Assistant Examiner* — Valerie N Newton
(74) *Attorney, Agent, or Firm* — Gardere Wynne Sewell LLP

(57) ABSTRACT

A process for producing two interleaved patterns on a substrate uses photolithography and etching to produce, on the substrate, a first pattern of first material protruding regions separated by recessed regions. A non-conformal deposition of a second material on the first pattern forms cavities in the recessed regions of the first pattern. These cavities are opened and filled with a third material. The second material is then removed, and the remaining third material forms a second pattern of third material protruding regions, wherein the second pattern is interleaved with the first pattern.

17 Claims, 7 Drawing Sheets

PROCESS FOR PRODUCING TWO INTERLEAVED PATTERNS ON A SUBSTRATE

PRIORITY CLAIM

This application claims priority from French Application for Patent No. 1055979 filed Jul. 22, 2010, the disclosure of which is hereby incorporated by reference.

TECHNICAL FIELD

The invention relates to the production of interleaved patterns, in particular self-aligned patterns, on a substrate, in particular a semiconductor substrate, especially for the fabrication of integrated circuits.

BACKGROUND

Manufacturers in the semiconductor-technology field are continually looking to produce electronic devices that are increasingly smaller and increasingly quicker, having electronic-element densities that are as high as possible.

A well-known technique for producing patterns on a semiconductor substrate consists in using a photolithographic technique. In this technique a pattern, such as an array of parallel lines, is produced on the substrate by depositing a film of material on the substrate, creating via photolithography a resist mask comprising openings corresponding to a pattern complementary to the pattern to be produced, then etching the material through the mask and removing the resist.

An optional subsequent step of transfer into the substrate consists in etching the substrate using the pattern produced as a hard mask.

However, this optical photolithography method is limited by the wavelength of the light source used to expose the resist. Currently lines having a width of 45 nm or less cannot be produced using optical lithography.

Thus another technique has been proposed called SIT (sidewall image transfer) by those skilled in the art. Production of interleaved patterns according to this technique is described in FIGS. 1a to 1f. In a first step illustrated in FIG. 1a, lines are produced in a material A using photolithography and etching. Then, in a second step, illustrated in FIG. 1b, a spacer is formed in a material B around each line of the material A. Next, in a third step illustrated in FIG. 1c, the material A is removed by selective etching, there remaining then only the spacers made of material B. In a fourth step illustrated in FIG. 1d, another photolithography step is carried out with a resist mask so as to remove, in a subsequent step illustrated in FIG. 1e, the ends of the spacers made of material B, and thus obtain, at the end of a final step of removing the resist, illustrated in FIG. 1f, a succession of lines made of material B separated by a gap twice as small as the lines, initially obtained by photolithography, made of material A.

However, this method requires two photolithography steps.

SUMMARY

According to one embodiment and method of implementation, a process is provided for forming two interleaved patterns on a semiconductor substrate, especially self-aligned patterns, and separated by a narrow space and making possible the use of only one single lithography step.

According to one aspect, a process for producing two interleaved patterns on a substrate is provided, comprising the use of photolithography and etching to produce, on the substrate, a first pattern, of a first material, comprising protruding regions separated by recessed regions, non-conformal deposition of a second material on the first pattern forming cavities in said recessed regions of the first pattern, opening said cavities, filling said opened cavities with a third material and removing the second material, the third material forming a second pattern interleaved with the first pattern.

Forming of the second material so as to create cavities may be achieved for example by using a non-conformal deposition of a material such as $SiO_2$, for example, or else by sputtering of the same material, these examples being non-limiting.

A non-conformal deposition may, for example, be carried out using plasma-enhanced chemical vapor deposition (PECVD) or else physical vapor deposition (PVD).

The cavities can be opened, for example, using chemical-mechanical polishing (CMP).

The cavities can be filled using spin-on deposition followed by chemical-mechanical polishing (CMP) or etching to remove the residual film of the third material left on the surface of the second material.

The second material may be removed using selective etching.

Advantageously, the first pattern may comprise equidistant protruding regions, and be configured so that said non-conformal deposition of the second material causes cavities to be formed respectively equidistant from the protruding regions.

In order to form cavities respectively equidistant from the protruding regions, it is preferable for the protruding regions adjacent to the cavity to have the same height.

The distance separating two protruding regions is preferably not too large relative to the height of the protrusions. This is because too large a distance separating the two protruding regions relative to the height of the protruding regions could prevent a cavity from forming between these two protruding regions. The dimensions (distance between the protruding regions and height of the protruding regions) allowing cavities to be obtained using a non-conformal deposition of a material on the protruding regions and recessed regions are well known to those skilled in the art, considering the properties of the type of deposition and of the material used. Those skilled in the art will know therefore to adjust these dimensions, considering especially the material used, so as to obtain cavities of the desired dimensions.

Advantageously, a first pattern may be produced comprising first equidistant parallel lines and a second pattern may be produced comprising interleaved second parallel lines between the first lines and equidistant from the first lines.

The first material of the first pattern and the third material of the second pattern may be identical or different.

It is also possible to produce, in another method of implementation, a first pattern comprising at least two pointed protruding regions, and to form a cavity between the two pointed regions causing, after filling with the third material and removal of the second material, a dot to form between the two pointed regions.

BRIEF DESCRIPTION OF THE DRAWINGS

Other advantages and features of the invention will become clear on examining the detailed description of non-limiting methods of implementation and the appended drawings in which.

DETAILED DESCRIPTION OF THE DRAWINGS

Reference is now made to FIGS. 2 and 3a to 3e. In a first step 101, a first pattern 2, of a first material, comprising protruding regions 2a separated by recessed regions 2b, is produced on the substrate 1. The production of this first pattern on the substrate 1 is illustrated in the view in cross section in FIG. 3a, in which, by way of example, the three protruding regions 2a are lines and the two recessed regions 2b are spaces separating two consecutive regions 2a. The first material is for example silicon nitride ($Si_3N_4$), or else silicon or a metal.

Figure 1A:
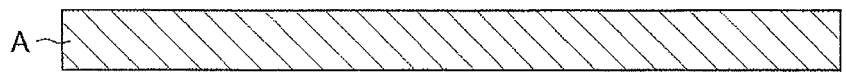
FIGS. 1a to 1f, mentioned above, show a process for obtaining patterns using what is called sidewall image transfer, according to the prior art.
Figure 1A:
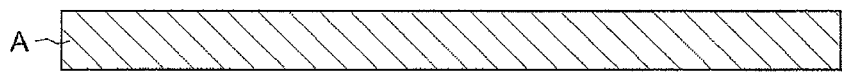
Figure 1A:
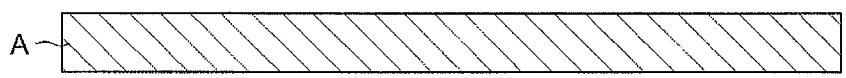
Figure 1B:
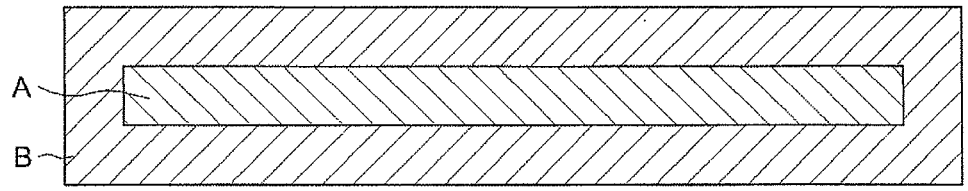
Figure 1B:
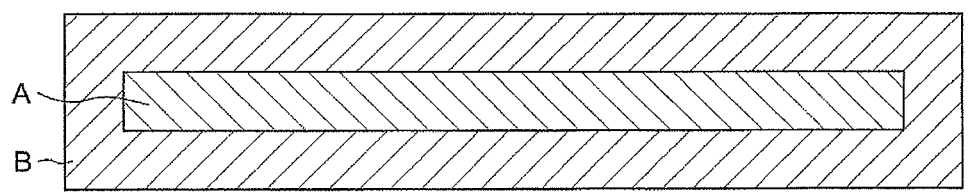
Figure 1B:
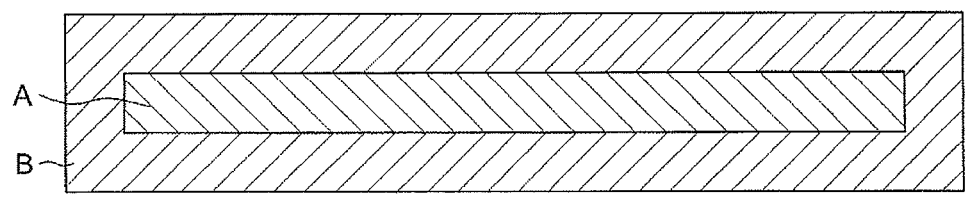
Figure 1C:
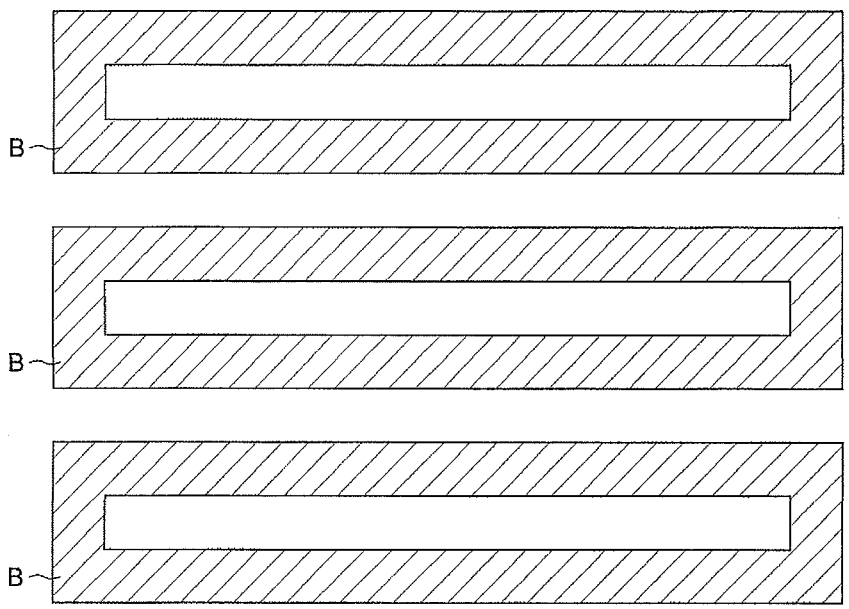
Figure 1D:
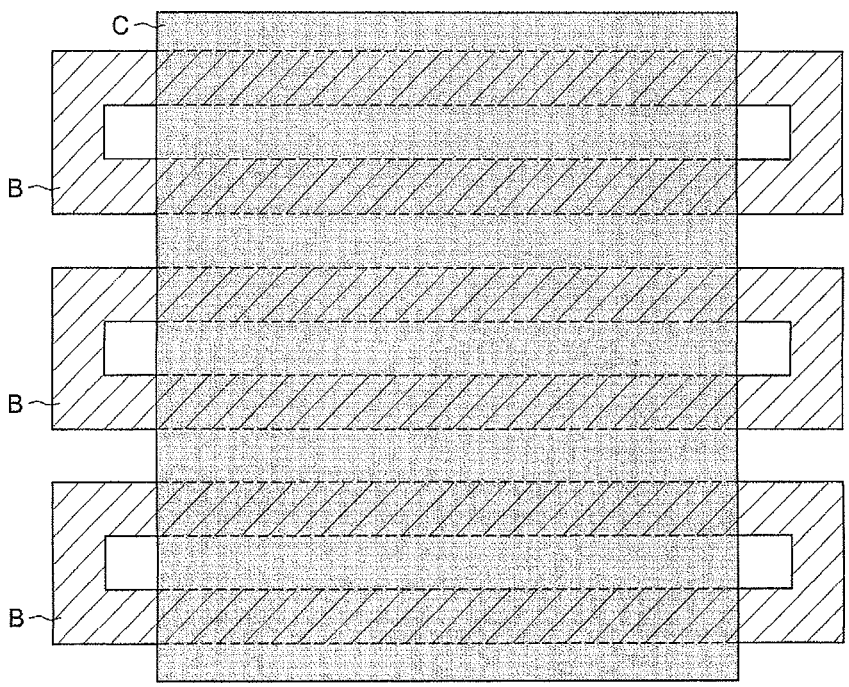
Figure 1E:
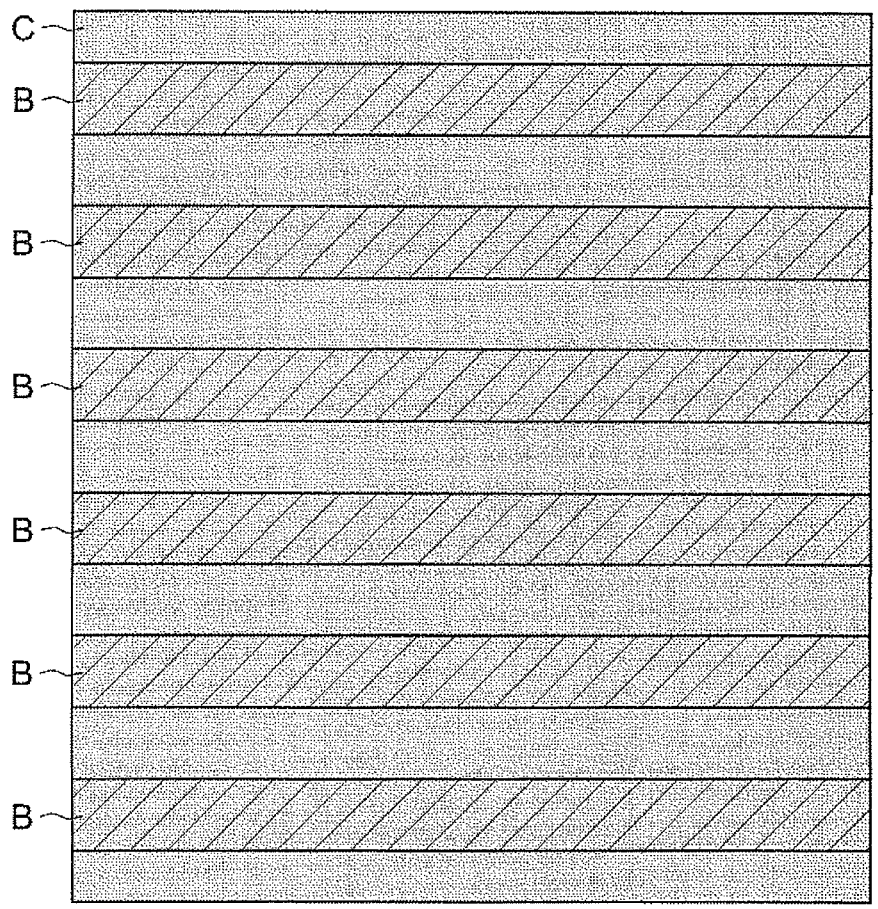
Figure 1F:
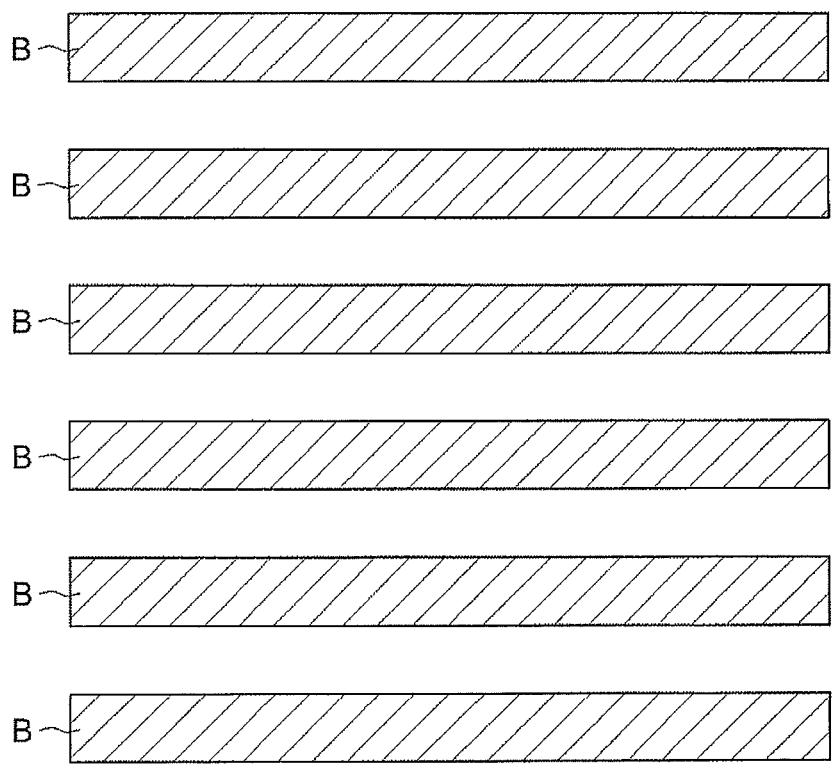
Figure 2:
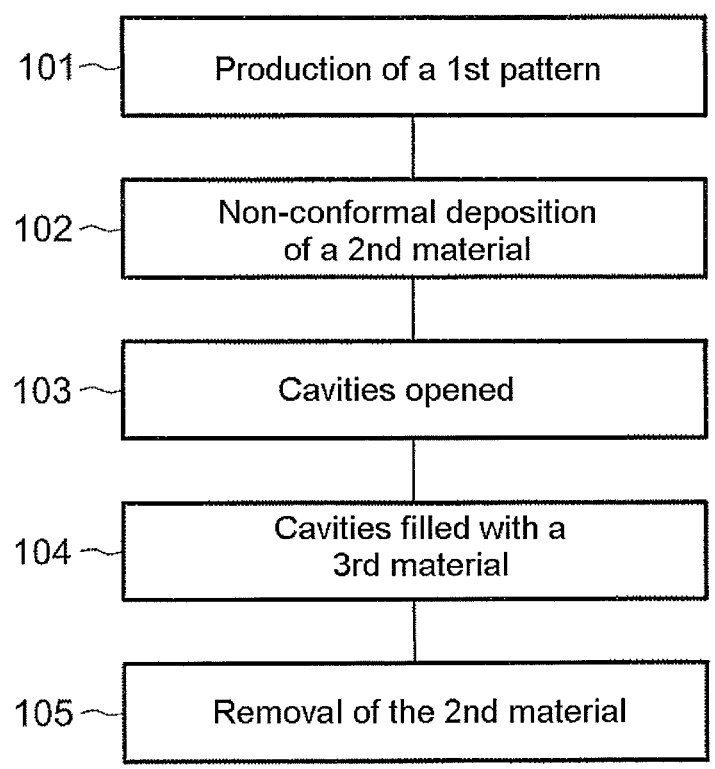
FIG. 2 shows a flow chart of a process for producing two patterns on a substrate according to one method of implementation.
Figure 3A:
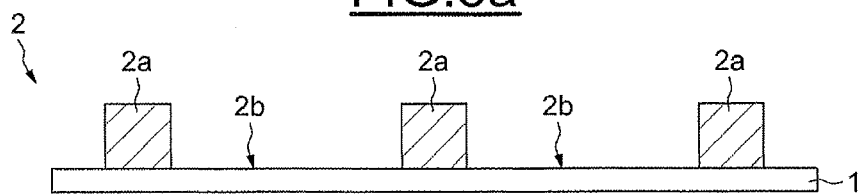
FIGS. 3a to 3e illustrate, in cross section, steps of the process for producing two patterns on a substrate according to the method of implementation presented in FIG. 2.
Figure 3B:
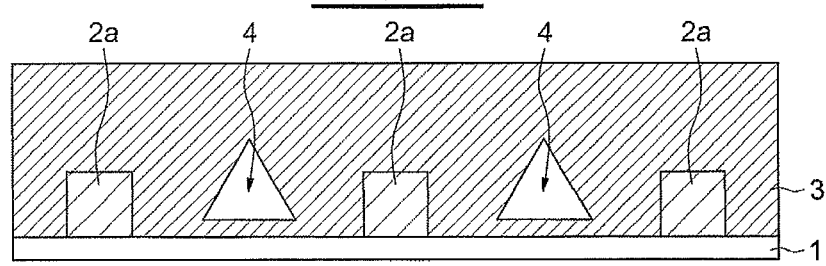

In a following step 102, a non-conformal deposition of a second material 3, for example silicon dioxide ($SiO_2$), is carried out. The non-conformal deposition is for example carried out using plasma-enhanced chemical vapor deposition (PECVD). This non-conformal deposition allows the substrate 1 and the first pattern 2 made of the first material, to be covered with the second material 3. As illustrated in FIG. 3b, the non-conformal deposition then causes cavities 4 to form in the recessed regions 2b.

A non-conformal deposition may also be achieved by sputtering silicon dioxide ($SiO_2$) onto the substrate. It turns out that this type of deposition does indeed cause cavities to form at the bottom of the recessed spaces between the metallic patterns.

The dimensions (distance between the protruding regions and height of the protruding regions) allowing cavities to be obtained using a non-conformal deposition of a material on the protruding regions and recessed regions are well known to those skilled in the art, considering the properties of the type of deposition and of the material 3 used. Those skilled in the art will know therefore to adjust these dimensions, considering especially the material used, so as to obtain cavities of the desired dimensions. By way of indication, those skilled in the art may refer for practical purposes to these documents: "A study of voids in sputtered $SiO_2$," Logan et al., page 1392 of the journal J. Vac. Sci. Technol. A, 7 (3), May/June 1989; and "Multi levels air gap integration using sacrificial material approach for advanced Cu interconnects technologies," Gras et al. ADMETA, Advanced Metallization Asian Session, (2008). The disclosures of these references are incorporated by reference herein.

Other than $SiO_2$, silicon nitride or else amorphous carbon may for example also be used as the second material 3.

Figure 3C:
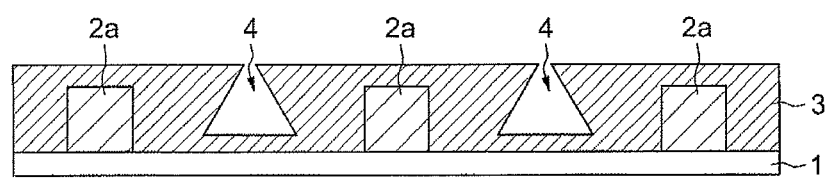

In a subsequent step 103 illustrated in FIG. 3c, the cavities 4 are opened, for example by chemical-mechanical polishing (CMP) of the entire surface of the assembly formed by the semiconductor substrate 1, the first pattern 2 made of the first material, and the second material 3. This chemical-mechanical polishing is here carried out only on the material 3, the cavities generally forming with a height greater that the height of the protruding regions 2a of the first pattern 2 made of the first material.

Figure 3D:
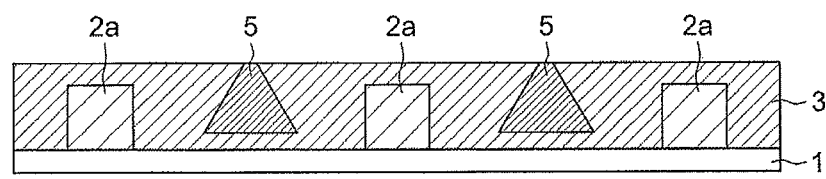

The opening of the cavities in step 103 allows, in a subsequent step 104 illustrated in FIG. 3d, the cavities 4 to be filled with a third material 5. This third material may for example be an oxide such as a SOG (spin-on glass), a polymer, or a metal. This filling of the cavities may be carried out by spin-on deposition of the material 5, followed by chemical-mechanical polishing so as to remove the residual film of material 5 from the surface of the material 3. A surface mainly consisting of the material 3, intersected with regions where the material 5 appears, is then obtained. This material 5 may be identical to the first material.

The filling may also be carried out using chemical vapor deposition (CVD), in particular when the third material is a metal.

Figure 3E:
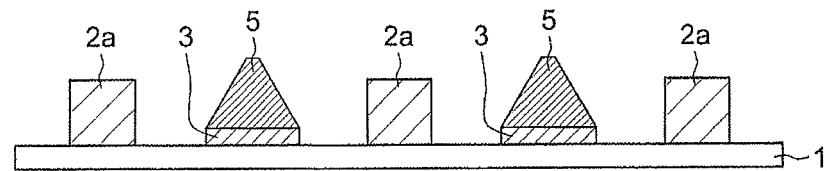

Finally, in a final step 105, the material 3 is removed, for example by selective etching of the material 3, the third material 5 thus forming a second pattern, interleaved with the first pattern 2 made of the first material, as illustrated in FIG. 3e.

Figure 4:
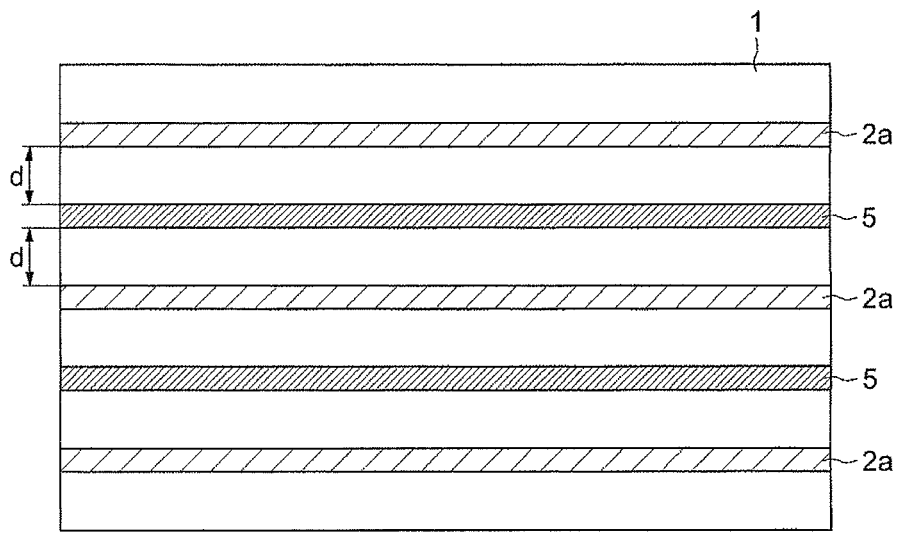
FIGS. 4 and 5 show schematic views of exemplary patterns.

FIG. 4 illustrates the case where the two interleaved and self-aligned patterns are parallel equidistant lines 5, thereby making it possible, with a single photolithography step, to obtain lines spaced apart by a distance d less than the etched width defined by the photolithography.

Figure 5:
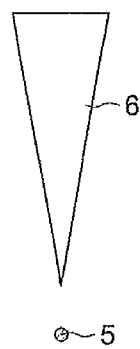
Figure 5:

In FIG. 5, another exemplary pattern has been shown. A first pattern comprises two protruding, pointed regions 6 on a semiconductor substrate. Following a non-conformal deposition of a material comparable to the material 3 on the first pattern, a cavity is formed in the shape of a spherical hole. After this cavity has been opened, it is then filled with a material comparable to the material 5. Once the material comparable to the material 3 has been removed, only the two protruding, pointed regions 6 then remain, between which there is a dot made of a material comparable to the material 5 (second pattern). By varying the shape of the protruding regions 6 it is possible to change the shape of the cavity and thus to better define the dot if necessary.

This method of implementation thus makes production of single electron transistors (SETs) possible.

What is claimed is:

1. A process for producing two interleaved patterns on a substrate, comprising:
    using photolithography and etching to produce, on the substrate, a first pattern, of a first material, comprising protruding regions separated by recessed regions,
    non-conformally depositing a second material on the first pattern forming cavities in said recessed regions of the first pattern,
    opening said cavities,
    filling said opened cavities with a third material, and
    removing the second material, wherein the remaining third material forms a second pattern interleaved with the first pattern.

2. The process according to claim 1, wherein the first pattern comprises equidistant protruding regions, and wherein the first pattern is configured so that said non-conformal deposition of the second material causes cavities to be formed in the recessed regions respectively equidistant from the protruding regions.

3. The process according to claim 1, wherein the first pattern comprises first equidistant parallel lines and the second pattern comprises interleaved second parallel lines between the first lines and equidistant from the first lines.

4. The process according to claim 1, wherein the first pattern comprises at least two pointed protruding regions and wherein non-conformally depositing produces the cavity between the two pointed regions, and wherein the second pattern is a dot formed between the two pointed regions.

5. The process according to claim 1, wherein the second pattern is formed of the remaining third material and second material underlying the remaining third material.

6. A process, comprising:
- producing a pattern of first protruding regions of a first material, wherein adjacent first protruding regions are separated by a recessed region;
- depositing a second material over the first protruding regions in a manner which produces a cavity in the second material located in the recessed region between the adjacent first protruding regions;
- filling the cavity with a third material;
- removing the second material while leaving the third material, resulting in a pattern of first protruding regions and a second protruding region located in the recessed region between the adjacent first protruding regions, the second protruding region formed at least of the remaining third material.

7. The process of claim 6, wherein the first protruding region has a linear shape and the second protruding region has a linear shape parallel to the linear shape of the first protruding region.

8. The process of claim 6, wherein the first protruding region has a pointed shape, the adjacent first protruding regions pointing at each other, and the second protruding region has a dot shape.

9. The process of claim 8, wherein the pointed shape is triangular and the dot shape is circular.

10. The process of claim 6, wherein depositing the second material comprises performing a non-conformal deposition of the second material.

11. The process of claim 6, wherein producing the pattern of first protruding regions comprises patterning a deposit of the first material using a photolithographic mask and etch process.

12. The process of claim 11, wherein the photolithographic mask and etch process has a minimum etch width between the adjacent first protruding regions, and wherein the resulting pattern of first protruding regions and the second protruding region has a width between adjacent protruding regions that is smaller than the minimum etch width.

13. The process of claim 5, wherein the second protruding region is formed of the remaining third material and second material underlying the remaining third material.

14. A process for producing two interleaved patterns on a substrate, comprising:
- using photolithography and etching to produce, on the substrate, a first pattern of first material protruding regions separated by recessed regions;
- performing a non-conformal deposition of a second material on the first pattern to form cavities in the recessed regions of the first pattern;
- opening the cavities;
- filling the opened cavities with a third material; and
- removing the second material such that the remaining third material forms a second pattern of third material protruding regions, wherein the second pattern is interleaved with the first pattern.

15. The process of claim 14, wherein each of the first material protruding regions has a linear shape and each of the third material protruding regions has a linear shape parallel to the linear shape of the first material protruding regions.

16. The process of claim 14, wherein each of the first material protruding regions has a pointed shape, with adjacent first material protruding regions pointed at each other, and each of the third material protruding regions has a dot shape positioned between adjacent first material protruding regions that are pointed at each other.

17. The process of claim 14, wherein the second pattern of third material protruding regions is formed of the remaining third material and second material underlying the remaining third material.

* * * * *